US008442786B2

(12) United States Patent
Naffziger et al.

(10) Patent No.: US 8,442,786 B2
(45) Date of Patent: May 14, 2013

(54) FLEXIBLE POWER REPORTING IN A COMPUTING SYSTEM

(75) Inventors: Samuel D. Naffziger, Fort Collins, CO (US); John P. Petry, San Diego, CA (US); Kiran K. Bondalapati, Los Altos, CA (US); Mom-Eng Ng, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 373 days.

(21) Appl. No.: 12/792,308

(22) Filed: Jun. 2, 2010

(65) Prior Publication Data

US 2011/0301889 A1 Dec. 8, 2011

(51) Int. Cl.
*G01R 21/00* (2006.01)
*G06F 1/00* (2006.01)

(52) U.S. Cl.
USPC ............................................ 702/62; 713/340

(58) Field of Classification Search ............... 702/62, 702/57, 60, 64–68, 70–76, 78, 81, 84, 127, 702/130–132, 182–183, 188–189; 324/76.11, 324/76.13, 76.15–76.16, 76.38–76.39; 374/100, 374/137; 700/9, 28, 108–109, 286, 291; 713/300, 310, 320, 322, 340
See application file for complete search history.

(56) References Cited

U.S. PATENT DOCUMENTS

| 5,712,826 A | 1/1998 | Wong et al. |
|---|---|---|
| 5,764,089 A | 6/1998 | Partovi et al. |
| 5,917,355 A | 6/1999 | Klass |
| 6,278,308 B1 | 8/2001 | Partovi et al. |
| 6,473,732 B1 | 10/2002 | Chen |
| 6,564,328 B1 | 5/2003 | Grochowski |
| 6,597,620 B1 | 7/2003 | McMinn |
| 6,611,435 B2 | 8/2003 | Kumar |
| 7,096,145 B2 | 8/2006 | Orenstien |
| 7,301,373 B1 | 11/2007 | Bailey et al. |
| 7,409,568 B2 | 8/2008 | Tam |
| 7,420,378 B2 | 9/2008 | Audet |
| 7,454,637 B2 | 11/2008 | Er |
| 7,464,276 B2 | 12/2008 | Rusu |
| 7,498,694 B2 | 3/2009 | Luo |
| 2006/0149975 A1 | 7/2006 | Rotem et al. |
| 2007/0156370 A1 | 7/2007 | White et al. |

(Continued)

OTHER PUBLICATIONS

McGowen et al., Power and Temperature Control on a 90-nm Itanium Family Processor, Jan. 2006, IEEE Journal of Solid-State Circuits, vol. 41, No. 1, pp. 229-237.*

(Continued)

*Primary Examiner* — Toan Le
(74) *Attorney, Agent, or Firm* — Rory D. Rankin; Meyertons, Hood, Kivlin, Kowert & Goetzel, P.C.

(57) ABSTRACT

A system and method for efficient reporting of power usage. A power reporting unit within a processor receives a power consumption number once every sample interval from a power monitor. The power monitor determines a power consumption number based on sampled signals within one or more functional blocks in the processor, rather than based on temperature. An average power consumption number is computed based on received power consumption numbers for a running time interval, wherein the running time interval is larger than the sample interval. This value is conveyed to an external agent. Responsive to receiving and processing the average power consumption number, the external agent may cause changes in a cooling system.

21 Claims, 7 Drawing Sheets

U.S. PATENT DOCUMENTS

| | | |
|---|---|---|
| 2008/0098242 A1 | 4/2008 | Peterson |
| 2008/0172565 A1 | 7/2008 | Chu et al. |
| 2010/0115304 A1 | 5/2010 | Finkelstein et al. |

OTHER PUBLICATIONS

Shrimpi: "AMD Reveals More Llano Details at ISSCC: 32nm, Power Gating, 4-cores Turbo:", Anand Tech.com Feb. 8, 2010; http://www.anandtech.com/print/2933.

Fischer, et al; "A 90nm Variable-Frequency Clock System for a Power-Managed Itanium®-Family Processor"; Solid-State Circuits Conference, 2005. Digest of Technical Papers. ISSCC. 2005 IEEE International, Publication Date: 10-10 Feb. 2005, pp. 294-295 & 599. vol. 1, San Francisco, CA, ISSN: 0193-6530, ISBN: 0-7803-8904-2.

Karnik, et al "Scaling trends of Cosmic Rays induced Soft Errors in static latches beyond 0.18 pts" 2001 Symposium on VLSI Circuits of Technical Papers, pp. 61-62.

Goel, et al "Low-Overhead Design of Soft-Error-Tolerant Scan Flip-Flops with Enhanced-Scan Capability" 2006 Asia and South Pacific Conference on Design Automation, Jan. 24-27, 2006 pp. 665-670.

Krishnamohan, et al "A Highly-Efficient Techniques for Reducing Soft Errors in Static CMOS Circuits" pp. 126-131, 2004 IEEE International Conference on Computer Design (ICCD'04), 2004.

Stokes: "AMD Reveals Fusion CPU+GPU to Challenge Intel in Laptops"; Arstecnica.com; Feb. 8, 2010; http://arstechnica.com/business/news/2010/02/amd-reveals-fusion-cpugpu-to-challenge-intel.

* cited by examiner

FLEXIBLE POWER REPORTING IN A COMPUTING SYSTEM

BACKGROUND OF THE INVENTION

1. Field of the Invention

This invention relates to computing systems, and more particularly, to efficient reporting of power usage.

2. Description of the Relevant Art

The power consumption of modern integrated circuits (IC's) has become an increasing design issue with each generation of semiconductor chips. As power consumption increases, more costly cooling systems such as larger fans and heat sinks must be utilized in order to remove excess heat and prevent IC failure. However, cooling systems increase system costs. The IC power dissipation constraint is not only an issue for portable computers and mobile communication devices, but also for high-performance microprocessors, which may include multiple processor cores, or cores, and multiple pipelines within a core.

High-performance microprocessors may be placed in servers, which may be grouped together in a server room such as a data center. Server racks within a data center comprise expensive hardware configured to store data, perform user requested transactions, and safeguard both the data and the processing of transactions. Cooling the server racks includes complex solutions and advanced cooling technology. For portable computers and servers, the cost of cooling systems may be reduced if the cooling system is able to dynamically adjust to a machine's current power usage. For example, an air conditioner may be adjusted for a data center to run at less than full capacity all day each day if an accurate report reliably communicates the power usage of the machines within the data center. Similarly, the cooling strategies may be adjusted on a timely basis or indefinitely changed when accurate power usage numbers are reported. Further, cooling strategies may also dynamically change within a portable computer if accurate power usage numbers are reported. f It may be difficult to obtain an accurate report of a given machine's power usage. Current methods for reporting power usage to software or an external agent such as a rack controller are not reliable or accurate. For example, both analog and digital thermal sensors may be placed throughout a semiconductor chip die. The thermal sensors provide information as to when the die heats up in a particular area due to increased compute activity. These thermal sensors rely on correlating temperature with power consumption. However, these sensors respond to each change in temperature whether it's driven by a compute-related boost in power consumption or by an external environmental factor, such as a rise in ambient temperature. In addition, there is a time delay between a compute-related boost in power consumption and a temperature increase. Further, analog current sensors that measure an amount of current drawn by circuits on a die typically have a large inaccuracy associated with readings. Also, these sensors report a current usage for a set of multiple cores rather than for each core individually. Therefore, it may be difficult to know if any and which of the cores has entered a compute-related boost in power consumption. Further still, available digital power monitors report current values for operating frequency, operational voltage, utilization and possibly a battery meter, but these values do not directly report a wattage value for power consumption.

In view of the above, efficient methods and mechanisms for efficient reporting of power usage are desired.

SUMMARY OF EMBODIMENTS OF THE INVENTION

Systems and methods for performing efficient reporting of power usage are contemplated.

In one embodiment, a power reporting unit within a processor receives a power consumption value once every sample interval from a power monitor. The power monitor determines a power consumption value based on data corresponding to activity levels of one or more functional blocks within the processor. This data corresponds to each of a number of sampled signals within the one or more functional blocks. By basing the power consumption value on sampled signals rather than temperature, both the power monitor and the power reporting unit are able to determine power usage values independent of environment variations. The power reporting unit is configured to compute an average power consumption value based on received power consumption values over a running time interval, wherein the running time interval is larger than the sample interval. Before conveying the average power consumption number to an external agent, the power reporting unit converts the power consumption value from a value measured in energy units particular to a die to a value measured in watts. The external agent may be an operating system, a controller for a data center rack system, or energy tracking software. Responsive to receiving and processing the average power consumption number, the external agent is configured to convey adjustments to a cooling system. The external agent may receive average power consumption numbers from multiple machines and determine the duration of the sample interval and the running time interval.

These and other embodiments will be further appreciated upon reference to the following description and drawings.

Figure 1:
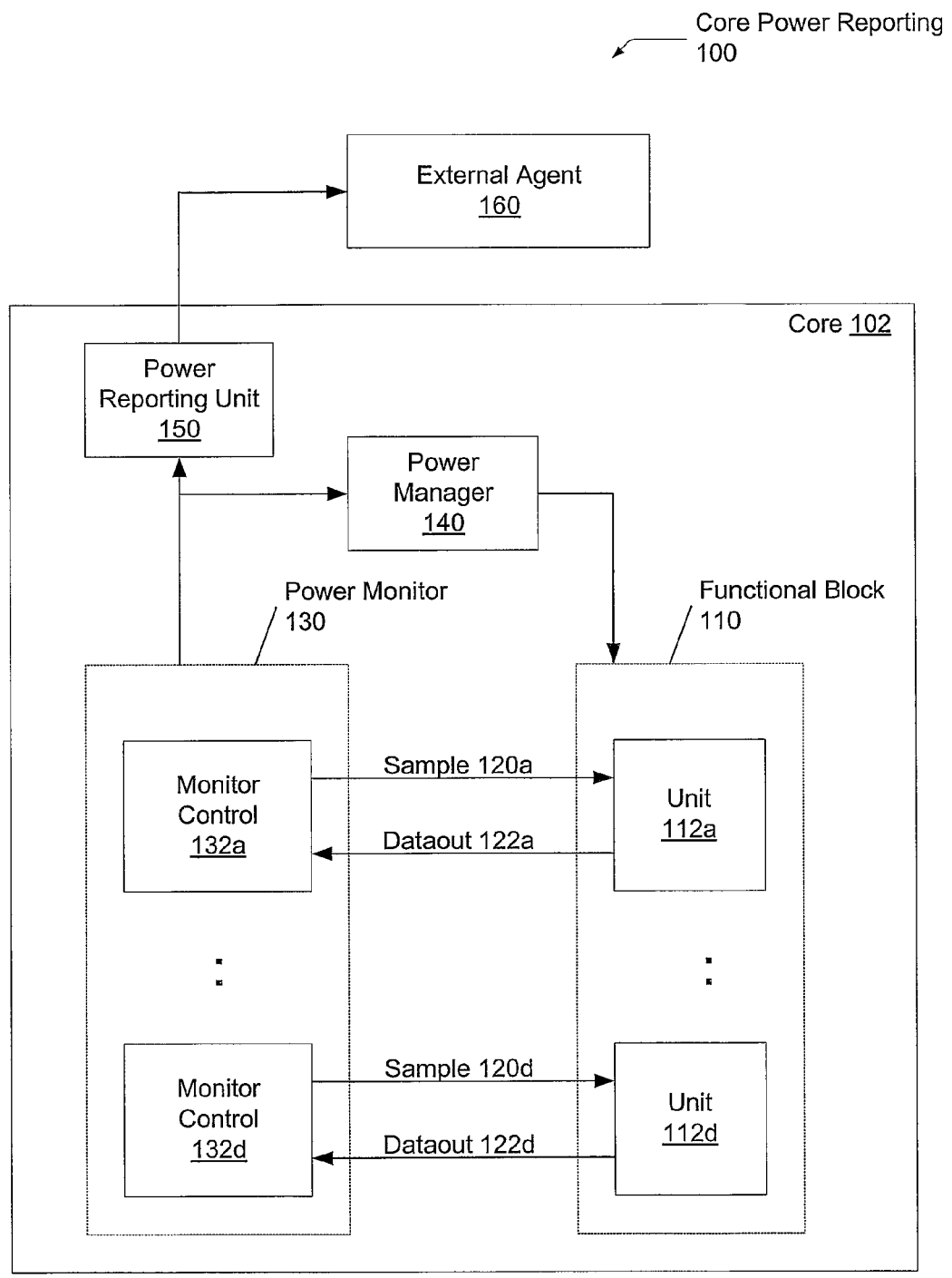
FIG. 1 is a generalized block diagram of one embodiment of a core power reporting system.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Referring to FIG. 1, one embodiment of a core power reporting system 100 is shown. Here, core 102 may be any integrated circuit (IC). In one embodiment, core 102 may be a processor core. A processor core may have an on-die instruction and data cache. The processor core may be a superscalar processor with a single pipeline or multiple pipelines. In another embodiment, core 102 may be an application specific IC (ASIC). Any transistor family may be used to implement core 102. Examples include metal oxide semiconductor field effect transistors (MOSFETs) and bipolar junction transistors (BJTs).

A functional block 110 may include transistors configured to perform logic functions, data storage, or other. For power management purposes, functional block 110 may be divided into units 132a-132d. As used herein, elements referred to by a reference numeral followed by a letter may be collectively referred to by the numeral alone. For example, units 132a-132d may be collectively referred to as units 132. In one embodiment, units 132 may not correspond to functional components of a processor, such as a reorder buffer, a memory management unit, an execution unit, and so forth. Rather, units 132 may be selected based on the types of signals that need to be sampled for power management purposes. For example, in one embodiment, clock enable signals routed to local clock distribution blocks may be the signals chosen to be sampled.

The selection of which signals to sample during a particular clock cycle may correspond to how well the selection correlates to the amount of switching node capacitance within units 132. The selected signals to be sampled, such as clock enable signals, may overlap functional blocks in the floorplan. Therefore, the division separating, for example, unit 132a and 132b may not correspond to a division in the floorplan. Units 132 are units that consume power and this power is to be measured in real-time.

In one embodiment, Power Monitor 130 may be used to collect data from units 132, such as the logic values of all the sampled signals. In one embodiment, the values of the sampled signals may be scanned out in a serial manner. Therefore, the selected signals may be sampled in a single clock cycle from each of Units 112 and serially scanned out before the next sample is performed. After collecting the data, Power Monitor 130 may calculate an energy consumption estimation. One Monitor Control 132 may correspond to each Unit 132. In alternative embodiments, a Monitor Control 132 may collect data for two or more Units 112 and calculate a total energy consumption estimation for those Units 112. In yet another embodiment, one Monitor Control 132 (i.e. Control 132a) may have a signal interface with one or more other Monitor Controls 132 (i.e. Controls 132b-132d) in order to collect data from the one or more Monitor Controls 132 (i.e. Controls 132b-132d). Then an energy consumption estimation for the one or more Monitor Controls 132 may be calculated.

The signals Sample 120 and Dataout 122 may be control and data signals used for power management purposes. The interface signals between Power Monitor 110 and Functional Block 130 may comprise any necessary number of signals and communication protocols. In one embodiment, the control signal Sample 120 may be asserted for a single clock cycle only during a chosen repeating interval, such as every 100 clock cycles. In one embodiment, at a predetermined number of clock cycles after the control signal Sample 120 is asserted, the data signal Dataout 122 may begin providing a logic value for a different sampled signal each clock cycle. In other words, the data signal Dataout 122 may be used to scan out a chain of values comprising the logic values of the sampled signals at a particular cycle. Also, in other embodiments, there may not be a single pair of signals between each Monitor Control 132 and Unit 112 pair. In an alternative embodiment, additional signals may be included in order for a Monitor Control 132 to poll a Unit 112, for a Unit 112 to acknowledge to a Monitor Control 132 that it is ready to convey output data.

When Power Monitor 130 calculates an energy consumption estimation from the data received from Functional Block 110 over repeated intervals, the Power Monitor 130 has determined a power profile of the currently running application(s). This determination is conveyed to the Power Manager 140 and the Power Reporting Unit 150. The Power Manager 140 may have an ability to alter an operating mode of functional block 110 in order to decrease (or increase) power if the application is above (below) a threshold limit.

The Power Reporting Unit 150 in FIG. 1 may have an ability to compute a running average of power over a specified time period. For example, the Power Reporting Unit 150 may track the power profile provided by the Power Monitor 130 as compared to a power target. In one embodiment, the power target is a thermal design power value for the functional block 110. The thermal design power (TDP), which may be also referred to as a thermal design point, represents a maximum amount of power a cooling system in a computer is able to dissipate. For example, a cooling system for a laptop processor may be designed for a 20 watt TDP. Therefore, it has been determined that the cooling system is able to dissipate 20 watts without exceeding the maximum junction temperature for transistors within the processor.

In one embodiment, during the specified time period named above, the Power Reporting Unit 150 may compute a signed running accumulated difference between the power profile provided by the Power Monitor 130 and the power target. At the end of the specified time period, the Power Reporting Unit 150 may determine an average of the signed accumulated difference over the specified time period. This average difference may be summed with the power target and then converted to an average power consumption value measured in the units of watts. A reason for this conversion may be both the power profile provided by the Power Monitor 130 and the signed accumulated difference may be measured in units of energy units particular to the functional block 110. These values may not be directly measured in units of watts in order to reduce the complexity of maintaining stored values related to the selected sampled signals and the computations for average power. Further details are provided later. While the values are used within core 102, no conversion may be performed and the Power Manager 140 is able to interpret a meaning for the values. However, prior to the Power Reporting Unit 150 conveying the power values outside of core 102 to the external agent 160, conversion to the units of watts may be performed.

The external agent 160 may be a controller that uses a reported power consumption number from the Power Reporting Unit 150 to make adjustments to manage the power consumption of core 102. In one embodiment, the external agent 160 may be an operating system or a separate software application dedicated to power management. In such a case, the operating system or the software application may utilize the received power consumption information to adjust a number of threads to execute, an assignment of threads to cores, an operational mode for core 102 that comprises at least an operational voltage and frequency, and so forth.

In another embodiment, the external agent 160 is a rack controller for a rack system housing servers in a data center. The rack controller may be an application specific integrated circuit (ASIC) or a more sophisticated processor. The rack controller may utilize the received power consumption information from multiple cores to adjust a cooling system within the data center. However, the rack controller may not perform conversions for different formats of energy units for the multiple cores. The rack controller may be configured to receive power consumption numbers in units of watts before determining potential thermal problems within the data center and possible solutions. In addition, the rack controller may be able to provide quicker responses to potential thermal problems when the information sent from the Power Reporting Unit 150 corresponds to actual activity levels and power consumption within core 102 and not temperature information.

Figure 2:
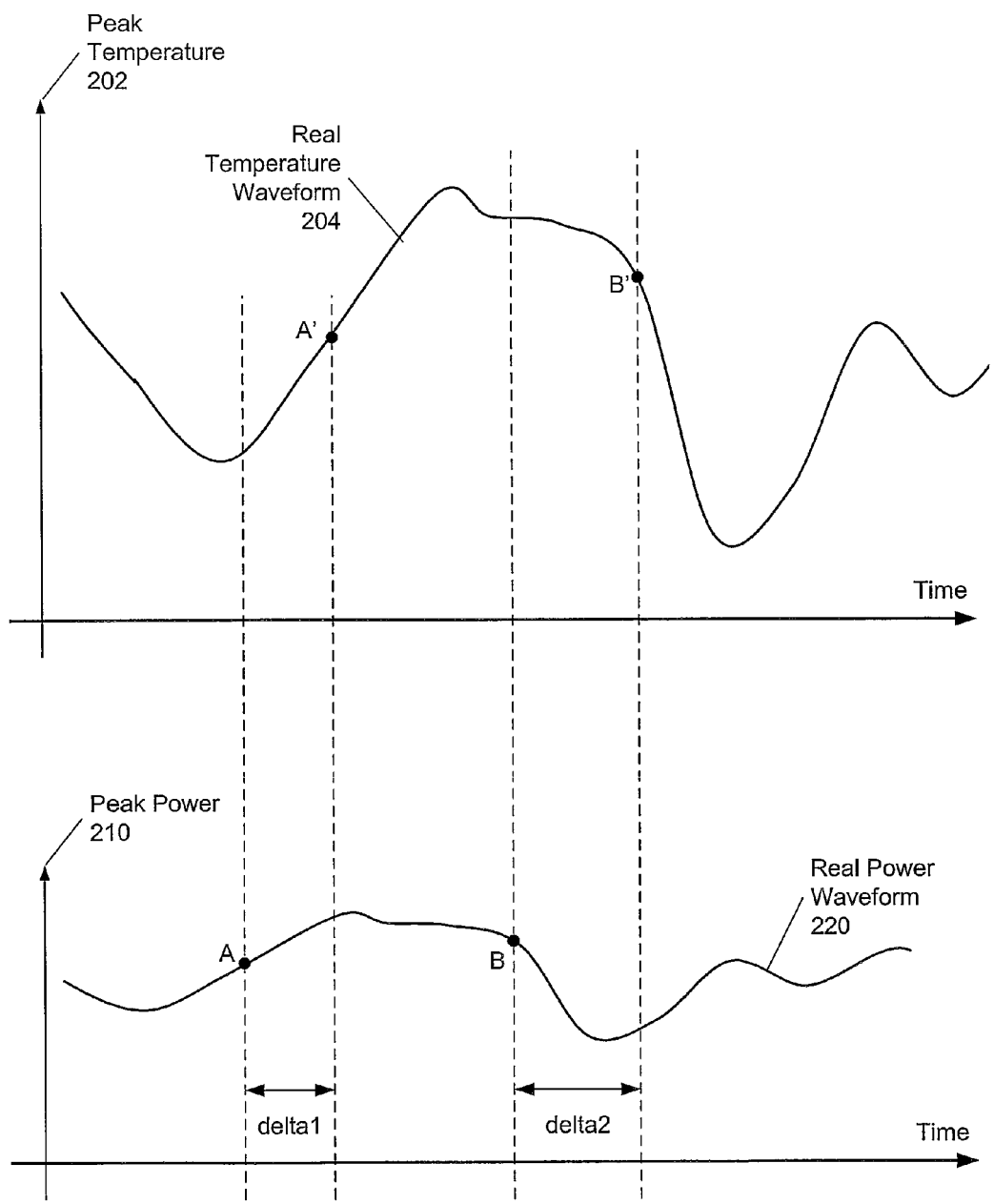
FIG. 2 is a generalized diagram of one embodiment of a time lag between actual power consumption and temperature.

Turning now to FIG. 2, one embodiment of a time lag between actual power consumption and temperature is shown. Real Power Waveform 220 shows the consumed power during a sample interval as a processor core executes one or more applications. In one embodiment, a sample interval may be in the range of tens of microseconds. In one embodiment, Real Power Waveform 220 is found by a power measurement performed on a core or a subdivision of the core, such as a unit, a functional component, or other. In one embodiment, a power model executed on a pre-silicon model of the core may perform this measurement. The Peak Power 210 may be defined by functional failure of the core or by executing a high power virus application on the core. In modern processors, a de-rated form of a high power virus application may be used to set the thermal design power (TDP) of the core. This de-rated, or derived, TDP code and its corresponding power consumption may be used to set the operational voltage and frequency of the core for binning purposes.

Analog or digital thermal sensors placed throughout the semiconductor chip die may determine the Real Temperature Waveform 204. The thermal sensors provide information as to when the die heats up in a particular area due to increased compute activity. However, these sensors respond to each change in thermals, whether it's driven by a compute-related boost in power consumption in the core or by an external environmental factor, such as a rise in ambient temperature. For example, surrounding servers in a rack system in a data center may cause a rise in ambient temperature. The amount of switching capacitance within a particular core may not change over a time interval, but the sensors may report higher thermal energy consumption due to the rise in ambient temperature. In addition, there is a time delay between a compute-related boost in power consumption and a temperature increase. For example, a period of time denoted by delta1 occurs between point A on the Real Power Waveform 220 and a corresponding point A' on the Real Temperature Waveform 204. The effect of the activity level and switching capacitance within a core at point A does not affect the temperature until point A'. However, the measurement of the temperature at point A' may include changes in the ambient temperature.

Similar to the description above for the time period delta1, a period of time denoted by delta2 occurs between point B on the Real Power Waveform 220 and a corresponding point B' on the Real Temperature Waveform 204. The effect of the activity level and switching capacitance within a core at point B does not affect the temperature until point B'. However, the measurement of the temperature at point B' may include changes in the ambient temperature. The changes in ambient temperature may be caused at least by surrounding servers in a data center, an air conditioning system in the data center, a rack cooling system and a rack structure that determines airflow in the data center.

Figure 3:
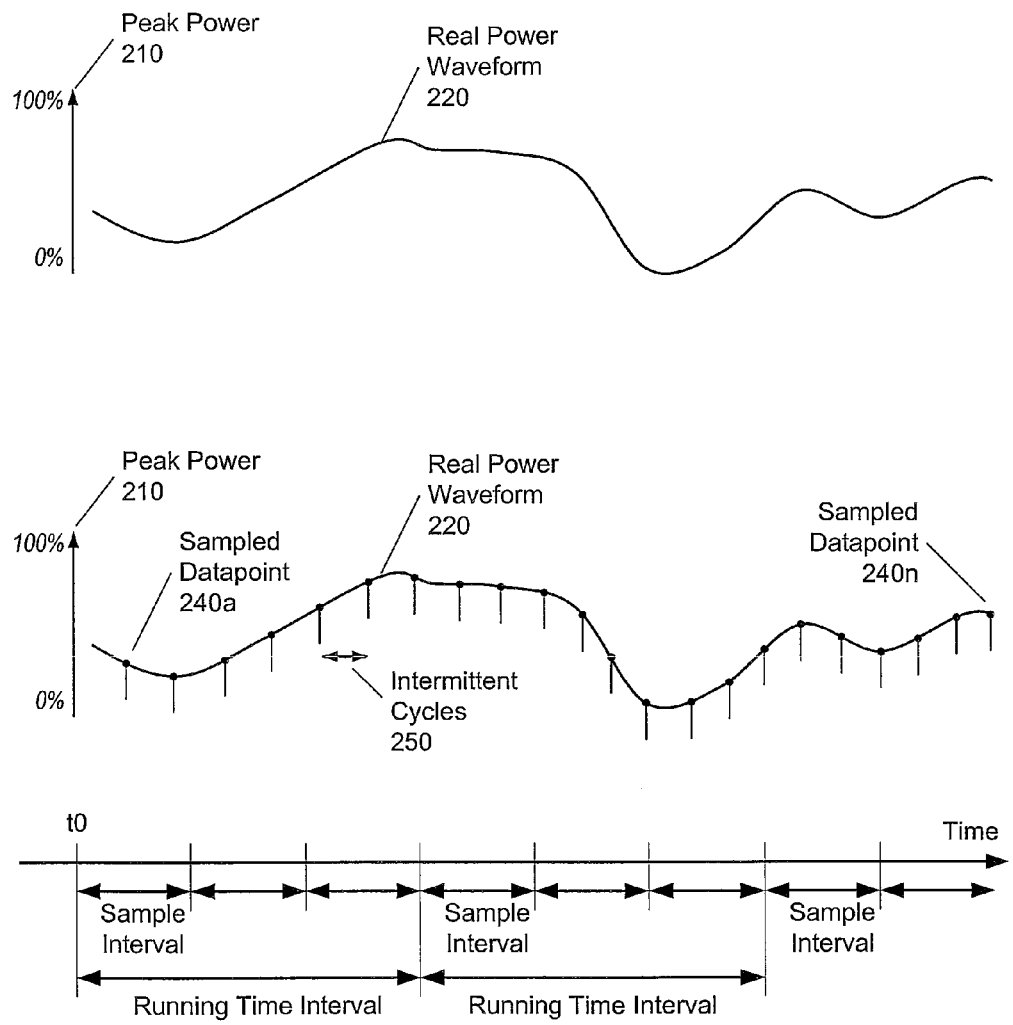
FIG. 3 is a generalized diagram of one embodiment of a power measurement using digital sampling during a repeating interval.

Referring now to FIG. 3, one embodiment of power measurement using digital sampling during an interval is shown. A Sampled Data Point 240 is taken during each number of Intermittent Cycles 250. In the illustrated embodiment, multiple samples are taken during the sample interval beginning with Sampled Data Point 240*a* and ending with Sampled Data Point 240*n*. The determination of the number of intermittent cycles to use may depend on the desired accuracy and confidence of the sampled data. For example, analysis including simulations and/or execution may be used to generate data on power consumption. Based on analysis, a table may be generated using both statistical analysis and measurements of both the real power consumption of an application and estimated power consumption from a sampling as shown in FIG. 3. In various embodiments, the table may be programmable (e.g., to adjust weights applicable to signals) in order to account for better estimates or otherwise. A confidence level and an error rate may be chosen to further develop the statistical analysis. Based on such analysis, selected signals may be chosen for sampling during operation. In various embodiment, existing or additional logic may be added to the design for the purpose of sampling and/or maintaining counts (e.g., using flops) corresponding to these signals. These selected signals may be selected for sampling based upon a determination that they have a relatively significant impact on power consumption. For example, various clock enable signals, bus driver enables, mismatches in content-addressable memories (CAM), and CAM word-line (WL) drivers may be chosen for sampling. In one embodiment, a count may be maintained for such signals during operation (e.g., when a clock enable is asserted). Based on these counts, an estimate of power consumption corresponding to the counts may be determined. For example, a table such as that described above may be used to correlate counts with estimated power consumption. In such an embodiment, the estimated power consumption would not, for example, be based on measures of thermal conditions or current draw. Various examples of a power estimation are described in patent application Ser. No. 12/101,598, filed Apr. 11, 2008, entitled "Sampling Chip Activity for Real Time Power Estimation", the entirety of which is incorporated herein by reference.

During each time interval denoted by Sample Interval in FIG. 3, the Power Monitor 130 may convey a power estimation value to the Power Reporting Unit 150. It is shown the Power Monitor 130 captures two sampled data points during each Sample Interval to simplify the illustration. It is known different choices are available for a number of data points to be captured within each Sample Interval. In one embodiment, the external agent 160 determines the duration of the Sample Interval.

For each of the power estimation values captured by the Power Reporting Unit 150 at the end of each Sample Interval, the Power Reporting Unit 150 may update a signed accumulating value. This signed accumulating value may be a running accumulated difference between the power estimation values provided by the Power Monitor 130 and the power target. Again, the power target may be a thermal design point (TDP) for functional block 110. The accumulated difference may be calculated at the end of each Sample Interval as AccTdpDeltaPwr=AccTdpDeltaPwr+(TDP−RcvdPwr).

Here, the variable RcvdPwr is the received power estimate value from the Power Monitor 130. In various embodiments, the power estimate value may simply be a number which indicates a relative activity level and may not itself be a measure of power consumption (e.g., a measure of watts may not be reported). The variable TDP is the thermal design point for functional block 110. If the received power estimate, RcvdPwr, corresponds to a value higher than the TDP, then the accumulated value AccTdpDeltaPwr drifts toward a negative value. If the received power estimate, RcvdPwr, is lower than the TDP, then the accumulated value AccTdpDeltaPwr drifts toward a positive value.

At the end of each Running Time Interval in FIG. 3, the current accumulated value AccTdpDeltaPwr is captured. For example, the current accumulated value AccTdpDeltaPwr may be loaded into a designated register. In FIG. 3, it is shown a single Running Time Interval comprises three Sample Intervals to simplify the illustration. It is known different choices are available for a number of Sample Intervals to be comprised within a single Running Time Interval. In one embodiment, the external agent 160 determines a value for a Running Time Interval.

In one embodiment, the Power Reporting Unit 150 may store values corresponding to the Sample Interval and the Running Time Interval in designated registers. The external agent 160 may update the values stored in these designated registers. In one embodiment, the capturing Running Time Interval may be computed as Sample Interval*$2^{(N+1)}$. For example, the Sample Interval may be set as 5 microseconds and the Running Time Interval may be set as 20 milliseconds. Therefore, the value for N is 11 and there are 4,000 Sample Intervals comprised within a single Running Time Interval. The values corresponding to Sample Interval and N may be selected to ensure the value AccTdpDeltaPwr does not saturate. In one embodiment, a counter with a programmable base frequency of Sample Interval may continue to count until the counter overflows bit N. When overflow occurs, the current value of AccTdpDeltaPwr may be captured in a designated register. This current captured value may be denoted as AccPwrCaptured. In one embodiment, the value AccTdpDeltaPwr, which is captured at the end of each Running Time Interval, is reset to 0 upon the value being captured in a register. In addition, the value AccTdpDeltaPwr may be reset to 0 when the external agent 160 changes the value TDP for functional block 110.

At the end of each Running Time Interval, the Power Reporting Unit 150 may compute a signed average power offset as TDP−(AccPwrCaptured/$2^{(N+1)}$), wherein AccPwrCaptured is the current value of AccTdpDeltaPwr as described above captured in a designated register. Also, as described above, the values TDP and AccPwrCaptured may be measured in scaled energy units, which may be different for each computer product. Therefore, a register may store a conversion coefficient used to convert the signed average power offset, which is computed as TDP−(AccPwrCaptured/$2^{(N+1)}$), to a value measured in watts. The conversion coefficient may be assigned such that the maximum power cannot exceed $2^8-2$. At the end of each Running Time Interval, the Power Reporting Unit 150 may compute a signed average power offset measured in units of watts as CurrPwrWatts=ConvCoeff*(TDP−(AccPwrCaptured/$2^{(N+1)}$)). The external agent 160 may receive the signed average power offset measured in units of watts, CurrPwrWatts, at the end of each Running Time Interval.

An example including the equations described above may include the external agent 160 setting the Sample Interval to 5 microseconds and the Running Time Interval to 20 milliseconds. Therefore, the value N is 11. With these settings, the value RcvdPwr is conveyed from the Power Monitor 130 to the Power Reporting Unit 150 every 5 microseconds and the Power Reporting Unit 150 computes the value AccTdpDeltaPwr every 5 microseconds. Similarly, the value AccPwrCaptured is captured by the Power Reporting Unit 150 every 20 milliseconds and the value AccTdpDeltaPwr is reset to 0 every 20 milliseconds.

Continuing with the above example, the computer product with functional block 110 may have a thermal design point of TDP=100 watts. The 100-watt value may be represented as 250 energy units within core 102. To simplify the example, the Power Monitor 130 may convey a steady-state average power value that is 90% of the power target, or (0.90*250) =225 energy units. The value RcvdPwr is 225 energy units every 5 microseconds. During a Running Time Interval of 20 milliseconds, there would be 4,000 samples, each sample with a computation of (TDP−RcvdPwr)=(250−225)=25 energy units. The value AccTdpDeltaPwr would be 4,000 samples*25 energy units=100,000 energy units. Since the computer product has a TDP of 100 watts, which is represented internally as 250 energy units, the conversion coefficient is 0.4. At the end of each Running Time Interval, or at the end of each 20 milliseconds, the Power Reporting Unit 150 is able to compute and convey the value CurrPwrWatts=ConvCoeff*(TDP−(AccPwrCaptured/$2^{(N+1)}$))=0.4*((250−(100,000/4,000))=90 watts. This value is the current power utilized over the last 20 milliseconds and reported to the external agent 160.

Figure 4:
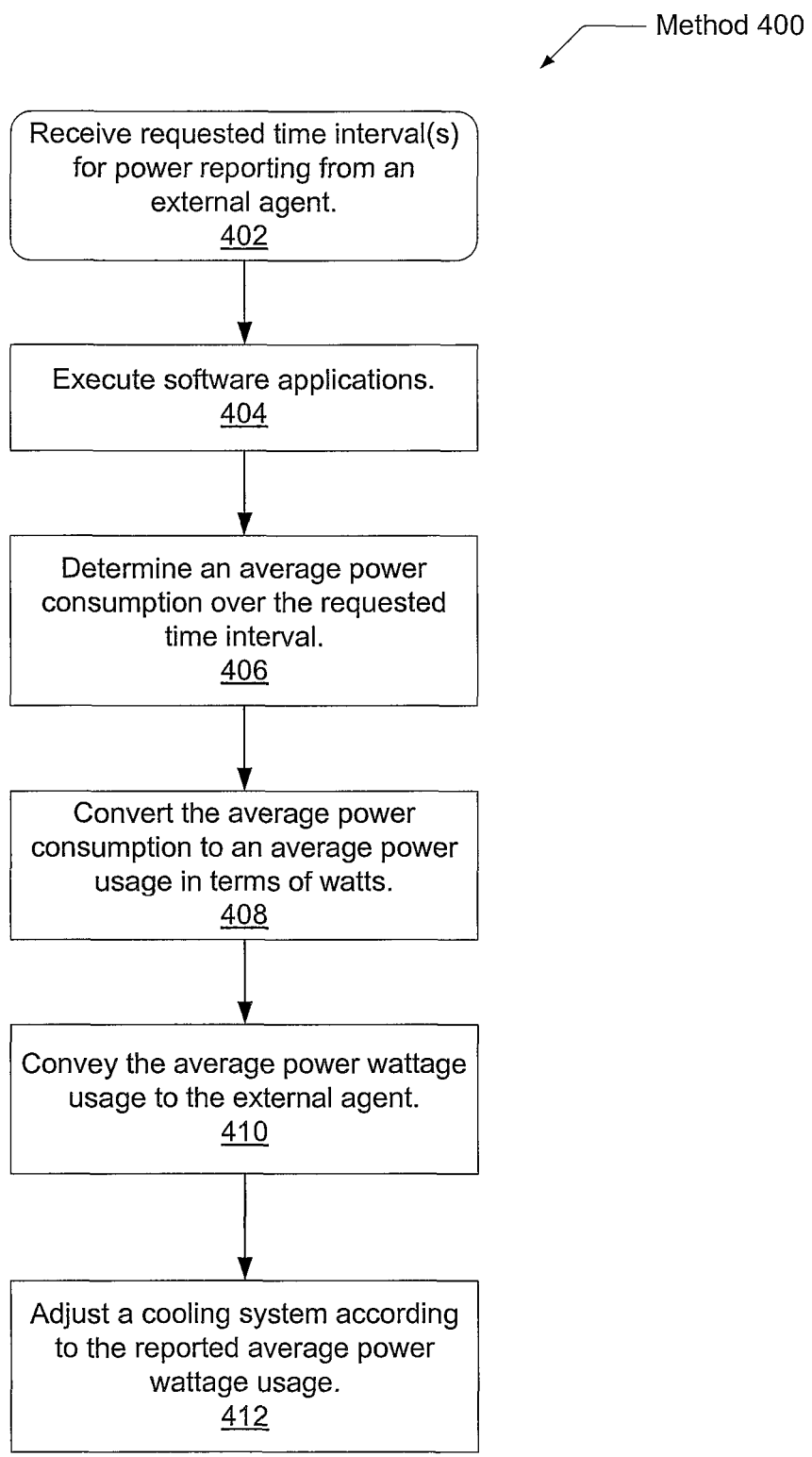
FIG. 4 is a flow diagram of one embodiment of a method for efficient reporting of power usage.

Referring now to FIG. 4, one embodiment of a method 400 for efficient reporting of power usage is shown. For purposes of discussion, the steps in this embodiment are shown in sequential order. However, some steps may occur in a different order than shown, some steps may be performed concurrently, some steps may be combined with other steps, and some steps may be absent in another embodiment.

In block 402, a processor may receive requested time interval(s) for power reporting from an external agent. For example, values for a Sample Interval and a Running Time Interval as described above may be conveyed to the processor. In block 404, the processor executes one or more software applications. In one embodiment, the processor may have been executing applications before receiving values for the time intervals. In block 406, the processor may determine average power consumption over the requested time interval for the die. This value may correspond to the expression (TDP−(AccPwrCaptured/$2^{(N+1)}$)) described earlier. In block 408, the processor may convert the average power consumption to a value measured in watts before conveying the value to an external agent in block 410. In block 412, the external agent may adjust a cooling system according to the reported average power wattage usage. In one embodiment, the external agent may be a rack controller that receives average power wattage usage values from multiple servers. According to the received data, the rack controller may adjust an air conditioning system; a cooling system coupled to the rack itself, or both.

Figure 5:
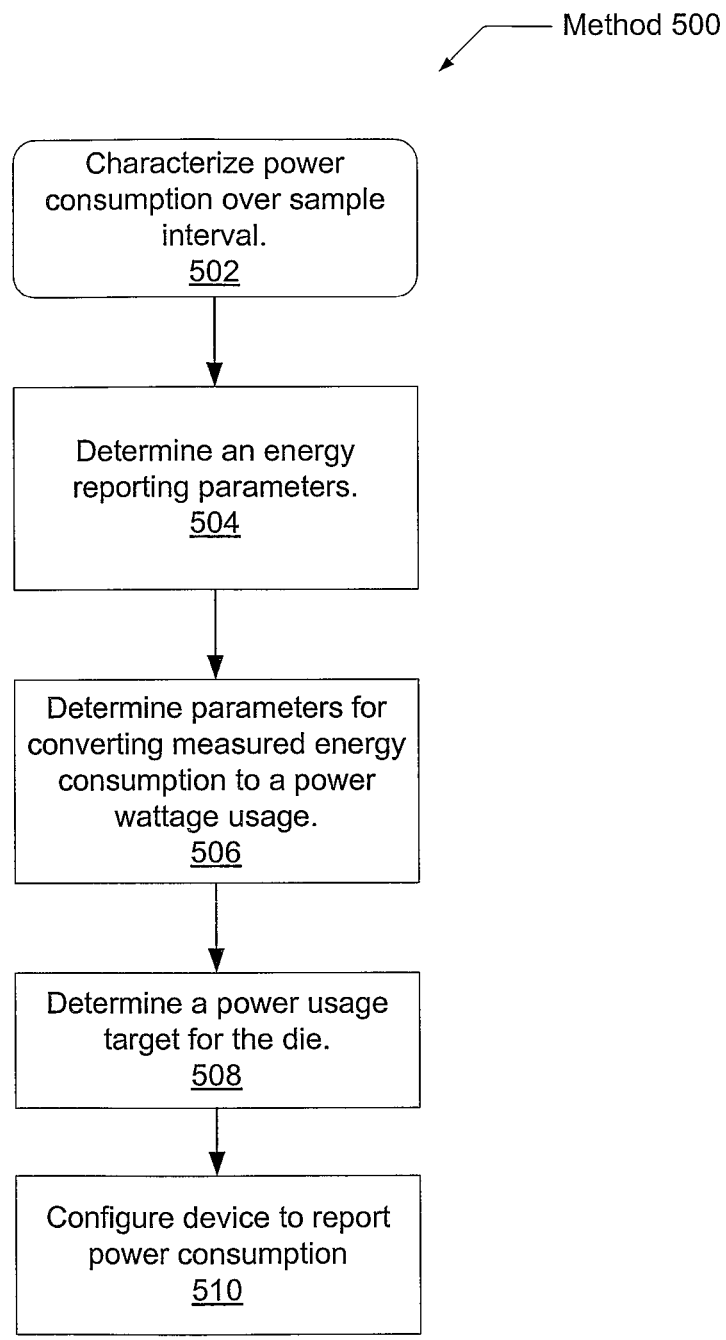
FIG. 5 is a flow diagram of one embodiment of a method for configuring a processing device to efficiently report power usage.

Turning now to FIG. 5, one embodiment of a method 500 for configuring a processor to efficiently report power usage is shown. For purposes of discussion, the steps in this embodiment are shown in sequential order. However, some steps may occur in a different order than shown, some steps may be performed concurrently, some steps may be combined with other steps, and some steps may be absent in another embodiment.

In the embodiment shown, a power model is developed and executed on the core or device over a broad set of applications in order to characterize power consumption over the die during sample intervals in block 502. In block 504, a power usage reporting mechanism/approach is determined, wherein the mechanism is independent of environment variations. For example, a Power Monitor may sample selected signals within functional blocks on the die and associate corresponding weights to the signals according to statistical analysis. In one embodiment, a Power Reporting Unit may sample the power usage numbers measured in energy units corresponding to the die. The Power Reporting Unit may update a signed accumulating average power value during a predetermined time as described above. This mechanism reports average power usage without being affected by environment variations such as changes in the ambient temperature.

In block 506, various parameters may be determined for converting reported power consumption values into power usage measured in watts. For example, a conversion coefficient may be determined for the die, wherein the coefficient converts a power usage value measured in energy units particular to the die to a power usage value measured in watts. In block 508, a thermal design point (TDP) is determined for the die. For example, a particular application may be executed on the die and its corresponding power usage may be measured. Finally, in block 510, the based on the characterizations, operating parameters may be conveyed to the device for use in configuring the processor to report power consumption. For example, particular time intervals for power reporting may be conveyed to the processor. These time intervals may correspond to the Sample Interval and Running Time Interval described earlier.

Figure 6:
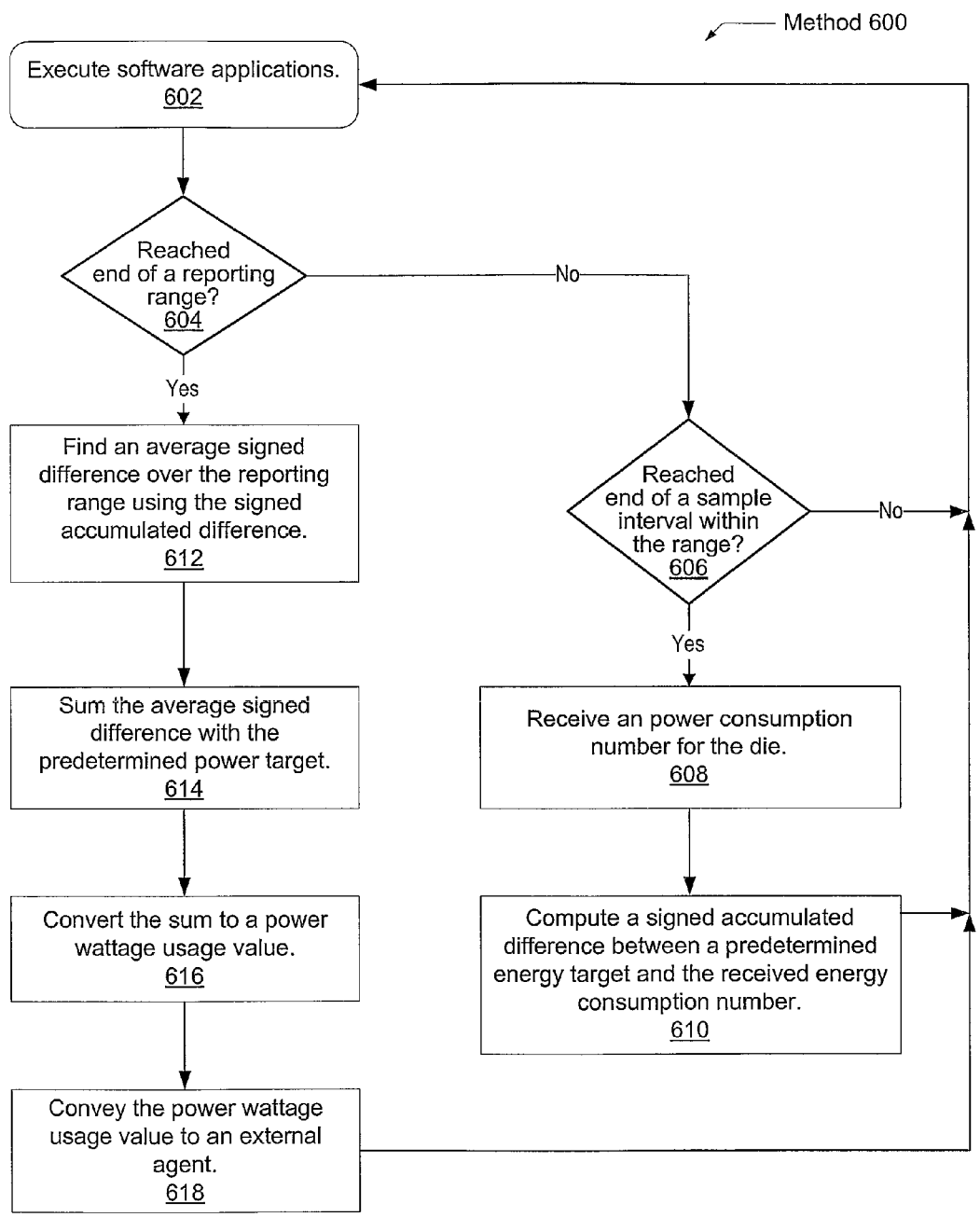
FIG. 6 is a flow diagram of another embodiment of a method for efficient reporting of power usage.

Referring now to FIG. 6, another embodiment of a method 600 for efficient reporting of power usage is shown. For purposes of discussion, the steps in this embodiment are shown in sequential order. However, some steps may occur in a different order than shown, some steps may be performed concurrently, some steps may be combined with other steps, and some steps may be absent in another embodiment.

In block 602, the processor executes instructions of one or more software applications. If the end of a reporting range, such as Running Time Interval described above, is not reached (conditional block 604), and further, the end of a sample interval within the range, such as Sample Interval described above, is not reached (conditional block 606), then control flow of method 600 returns to block 602. If the end of the sample interval within the range is reached (conditional block 606), then in block 608, a power monitor may convey a power consumption number for the die to a power reporting unit as described earlier. For example, the value RcvdPwr measured in energy units particular to the die may be sent from the power monitor to the power reporting unit. In block 610, the power reporting unit may compute a signed accumulated difference between a predetermined power target, such as a TDP, and the received power consumption number, such as RcvdPwr. The computation as described earlier may be AccTdpDeltaPwr=AccTdpDeltaPwr+(TDP−RcvdPwr). Control flow of method 600 then returns to block 602.

If the end of a reporting range, such as Running Time Interval described above, is reached (conditional block 604), then in block 612, a power reporting unit may find an average signed difference over the reporting range using the signed accumulated difference. The computation as described earlier may be AccPwrCaptured/$2^{(N+1)}$, wherein AccPwrCaptured is the current value of AccTdpDeltaPwr by the end of the Running Time Interval and N corresponds to the value of Running Time Interval. In block 614, the average signed difference over the reporting range is summed with the predetermined power target as (TDP−(AccPwrCaptured/$2^{(N+1)}$)). This value is the power usage of the die over the time duration of the last reporting range. However, this power usage value is measured in energy units particular to the die. In order to report a power usage value to an external agent, this value is converted with a conversion coefficient in block 616 to a power usage value measured in units of watts. In block 618, the converted power usage value is sent to the external agent.

Figure 7:
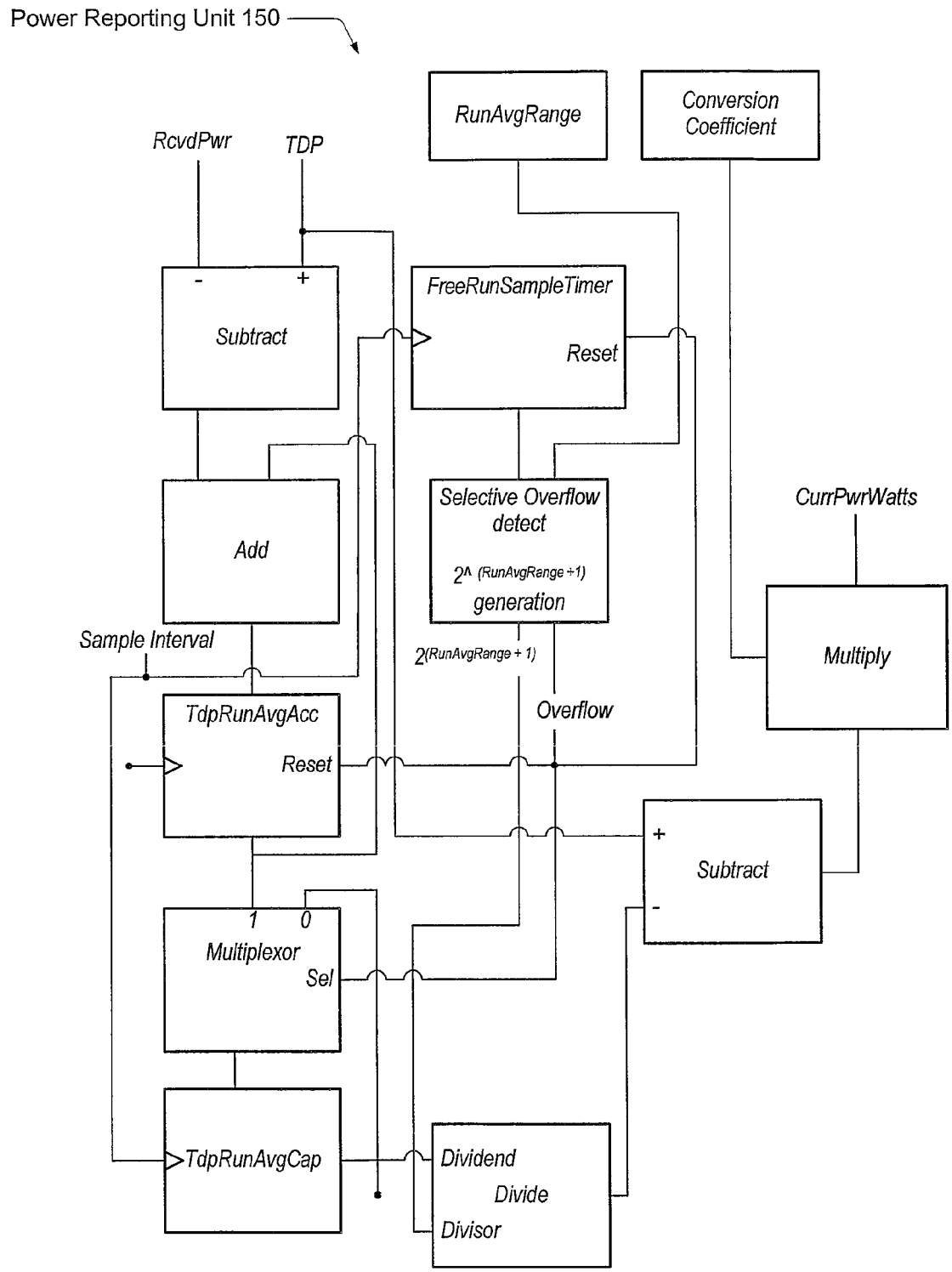
FIG. 7 is a block diagram of one embodiment of a power reporting unit.

Turning now to FIG. 7, one embodiment of a generalized block diagram of a Power Reporting Unit 150 is shown. The input values RcvdPwr, TDP, RunAvgRunning Time Interval (the reporting range corresponding to the value N described above), conversion coefficient, and Sample Interval are used to produce the output CurrPwrWatts. The computations described earlier are one example of producing an accurate power usage value measured in the units of watts. The circuits and logic shown in FIG. 7 are one example of a mechanism for performing the computations.

It is noted that the above-described embodiments may comprise software. In such an embodiment, program instructions and/or a database (both of which may be referred to as "instructions") that represents the described systems and/or methods may be conveyed or stored on a computer readable medium. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Additionally, the instructions may comprise behavioral-level descriptions or register-transfer level (RTL) descriptions of the hardware functionality in a programming language such as C, or a design language (e.g., HDL) such as Verilog, VHDL, or a database format such as GDS II stream format (GDSII). These instructions may then be read and used to fabricate hardware comprising the system (or portions of the system). In some cases the description may be read by a synthesis tool (e.g., program code running on a computing device) to form an implementation of the design. For example, such a tool may be used to synthesize the description to produce a netlist comprising a list of gates from a synthesis library. The netlist may generally comprise a set of gates which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. Alternatively, the instructions on the computer accessible storage medium may be the netlist (with or without the synthesis library) or the data set, as desired. Additionally, the instructions may be utilized for purposes of emulation by a hardware based type emulator, such as those from vendors Cadence®, EVE®, and Mentor Graphics®. For example, in such an embodiment the instructions may be utilized to configure FPGA based hardware to perform according to the design. Numerous such embodiments are possible and are contemplated.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system comprising:
a power monitor configured to determine a power consumption value once every sample interval for each of one or more functional blocks within a processor core based on counts corresponding to selected signals within an associated functional block of the one or more functional blocks;
a power reporting unit configured to:
compute an average power consumption value based on two or more power consumption values determined by the power monitor for a running time interval, wherein the running time interval is greater than the sample interval;
convert the average power consumption value to units recognizable by an external agent; and
convey the average power consumption value to the external agent.

2. The computing system as recited in claim 1, wherein the average power consumption value is a value represented in units of watts.

3. The computing system as recited in claim 2, wherein the power reporting unit is further configured to utilize one or more coefficients based on electrical characteristics of the one or more functional blocks to convert the power consumption values to an average value measured in units of watts.

4. The computing system as recited in claim 1, wherein the external agent is configured to convey adjustments to a cooling system responsive to the average power consumption value, wherein the average power consumption value is based on a number of functional blocks less than a total number of functional blocks in the processor core.

5. The computing system as recited in claim 1, wherein during the running time interval, the power reporting unit is further configured to compute a signed accumulated difference between a power target and each determined power consumption value.

6. The computing system as recited in claim 5, wherein the power target corresponds to a thermal design power value for the one or more functional blocks.

7. The computing system as recited in claim 5, wherein the power reporting unit is further configured to reset the accumulated difference (i) once every said running time interval, or (ii) responsive to detecting a change in the power target.

8. The computing system as recited in claim 1, wherein the power monitor is further configured to associate programmable weights to the selected signals, wherein the selected signals comprise at least one or more of the following: content-addressable memory (CAM) word-line driver outputs, bus driver enable signals, and clock enable signals.

9. A method implemented by a computing system for efficiently reporting power usage, the method comprising:
determining a power consumption value once every sample interval for each of one or more functional blocks within a processor core based on counts corresponding to selected signals within an associated functional block of the one or more functional blocks;
computing an average power consumption value based on two or more power consumption values for a running time interval, wherein the running time interval is greater than the sample interval;
convert the average power consumption value to units recognizable by an external agent; and conveying the average power consumption value to the external agent.

10. The method as recited in claim 9, wherein the average power consumption value is a value represented in units of watts.

11. The method as recited in claim 9, further comprising the external agent conveying adjustments to a cooling system responsive to the average power consumption value, wherein the average power consumption value is based on a number of functional blocks less than a total number of functional blocks in the processor core.

12. The method as recited in claim 9, wherein during the running time interval, the method further comprises computing a signed accumulated difference between a power target and each received power consumption value.

13. The method as recited in claim 12, wherein the power target corresponds to a thermal design power value for the one or more functional blocks.

14. The method as recited in claim 12, further comprising resetting the accumulated difference (i) once every said running time interval, or (ii) when the external agent changes a power target.

15. The method as recited in claim 12, further comprising associating programmable weights to the selected signals, wherein the selected signals comprise at least one or more of the following: content-addressable memory (CAM) word-line driver outputs, bus driver enable signals, and clock enable signals.

16. The method as recited in claim 9, further comprising utilizing one or more coefficients based on electrical characteristics of the one or more functional blocks to convert the power consumption value to an average value measured in units of watts.

17. A power reporting unit comprising:
a first interface configured to receive a power consumption value once every sample interval from a power monitor, wherein the power consumption value is based on counts corresponding to selected signals within an associated functional block of the one or more functional blocks within a processor core;
circuitry configured to:
compute an average power consumption value based on received power consumption values for a running time interval, wherein the running time interval is larger than the sample interval;
convert the average power consumption value to units recognizable by an external agent; and
a second interface configured to convey the average power consumption value to the external agent.

18. The power reporting unit as recited in claim 17, wherein during the running time interval, the circuitry is further configured to compute a signed accumulated difference between a power target and each received power consumption number.

19. The power reporting unit as recited in claim 17, wherein the power target corresponds to a thermal design power number for the one or more functional blocks.

20. A non-transitory computer readable medium comprising instructions which is operated upon by a program executable on a computer system, wherein the program operating on the instructions is executable to perform a portion of a process to fabricate an integrated circuit including circuitry described by the instructions, the circuitry described in the instructions including:
a first interface configured to receive a power consumption value once every sample interval from a power monitor, wherein the power consumption value is based on counts of selected signals within an associated functional block of the one or more functional blocks within a processor core;

circuitry configured to:
compute an average power consumption value based on received power consumption values for a running time interval, wherein the running time interval is larger than the sample interval;
convert the average power consumption value to units recognizable by an external agent; and a second interface configured to convey the average power consumption value to the external agent.

21. The computer readable medium of claim 20, wherein said instructions comprise one or more of C, HDL, Verilog or GDSII.

* * * * *